US009956649B2

(12) United States Patent
Ikeda et al.

(10) Patent No.: US 9,956,649 B2
(45) Date of Patent: *May 1, 2018

(54) SOLDER ALLOY, SOLDER PASTE, AND ELECTRONIC CIRCUIT BOARD

(71) Applicant: HARIMA CHEMICALS, INCORPORATED, Kakogawa-shi, Hyogo (JP)

(72) Inventors: Kazuki Ikeda, Hyogo (JP); Kosuke Inoue, Hyogo (JP); Kazuya Ichikawa, Hyogo (JP); Tadashi Takemoto, Ibaraki (JP)

(73) Assignee: HARIMA CHEMICALS, INCORPORATED, Kakogawa-Shi, Hyogo (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 14/442,597

(22) PCT Filed: Aug. 28, 2014

(86) PCT No.: PCT/JP2014/072576
§ 371 (c)(1),
(2) Date: May 13, 2015

(87) PCT Pub. No.: WO2015/198497
PCT Pub. Date: Dec. 30, 2015

(65) Prior Publication Data
US 2016/0288271 A1 Oct. 6, 2016

(30) Foreign Application Priority Data

Jun. 24, 2014 (JP) .................. 2014-129472

(51) Int. Cl.
C22C 13/02 (2006.01)
B23K 35/26 (2006.01)
C22C 13/00 (2006.01)
B23K 35/02 (2006.01)
B23K 35/22 (2006.01)
B23K 35/36 (2006.01)
H05K 3/34 (2006.01)
B23K 35/362 (2006.01)
B23K 101/36 (2006.01)
B23K 101/42 (2006.01)

(52) U.S. Cl.
CPC .......... *B23K 35/262* (2013.01); *B23K 35/025* (2013.01); *B23K 35/0205* (2013.01); *B23K 35/0227* (2013.01); *B23K 35/0244* (2013.01); *B23K 35/22* (2013.01); *B23K 35/26* (2013.01); *B23K 35/36* (2013.01); *B23K 35/362* (2013.01); *B23K 35/3606* (2013.01); *B23K 35/3612* (2013.01); *B23K 35/3613* (2013.01); *B23K 35/3616* (2013.01); *B23K 35/3618* (2013.01); *C22C 13/00* (2013.01); *C22C 13/02* (2013.01); *H05K 3/3484* (2013.01); *B23K 2201/36* (2013.01); *B23K 2201/42* (2013.01); *H05K 3/3457* (2013.01)

(58) Field of Classification Search
CPC ...................................................... C22C 13/00
See application file for complete search history.

(56) References Cited

U.S. PATENT DOCUMENTS

| 5,733,501 A * | 3/1998 | Takao ................. B23K 35/262 420/557 |
| 6,176,947 B1 | 1/2001 | Hwang et al. |
| 6,224,690 B1 * | 5/2001 | Andricacos ............ B32B 15/01 148/400 |
| 6,367,683 B1 | 4/2002 | Rass et al. |
| 8,598,464 B2 | 12/2013 | Sakatani et al. |
| 9,445,508 B2 | 9/2016 | Nakanishi et al. |
| 2003/0015575 A1 | 1/2003 | Yamaguchi et al. |
| 2007/0178007 A1 | 8/2007 | Thantrong et al. |
| 2008/0292492 A1 | 11/2008 | Ingham et al. |
| 2009/0232696 A1 | 9/2009 | Ohnishi et al. |
| 2010/0084050 A1 | 4/2010 | Kraemer et al. |
| 2010/0294565 A1 | 11/2010 | Kawamata et al. |

(Continued)

FOREIGN PATENT DOCUMENTS

| CN | 1392817 A | 1/2003 |
| CN | 101537545 A | 9/2009 |

(Continued)

OTHER PUBLICATIONS

Claims dated Apr. 27, 2016 of copending U.S. Appl. No. 1/414453.*
International Preliminary Report on Patentability (Form PCT/IB/373) and Written Opinion of the International Search Authority (Form PCT/IB/237) dated Dec. 27, 2016 by the International Bureau of WIPO, in corresponding PCT/JP2014/072576, and English translations thereof (11 pages).
International Search Report (PCT/ISA/210) dated Oct. 7, 2014, by the Japanese Patent Office as the International Searching Authority for International Application No. PCT/JP2014/072576.

(Continued)

Primary Examiner — Roy V King
Assistant Examiner — Jophy S. Koshy
(74) Attorney, Agent, or Firm — Buchanan, Ingersoll & Rooney PC

(57) ABSTRACT

A solder alloy substantially consists of tin, silver, indium, bismuth, and antimony. With respect to the total amount of the solder alloy, the content ratio of the silver is 2.8 mass % or more and 4 mass % or less; the content ratio of the indium is 6.2 mass % or more and 9.0 mass % or less; the content ratio of the bismuth is 0.7 mass % or more and 5.0 mass % or less; the content ratio of the antimony is 0.3 mass % or more and 5.0 mass % or less; and the content ratio of the tin is the remaining ratio and the value of A is 4.36 or less wherein A=0.87×[In content ratio (mass %)]−0.41×[Ag content ratio (mass %)]−0.82×[Sb content ratio (mass %)].

6 Claims, No Drawings

(56) References Cited

U.S. PATENT DOCUMENTS

| | | |
|---|---|---|
| 2010/0307823 A1 | 12/2010 | Kawamata et al. |
| 2011/0120769 A1 | 5/2011 | Sakatani et al. |
| 2012/0018048 A1 | 1/2012 | Yamashita et al. |
| 2012/0175020 A1 | 7/2012 | Imamura et al. |
| 2013/0327444 A1 | 12/2013 | Sawamura et al. |
| 2014/0112710 A1 | 4/2014 | Albrecht et al. |
| 2015/0136461 A1 | 5/2015 | Imamura et al. |
| 2015/0305167 A1* | 10/2015 | Nakanishi ............... C22C 13/00 174/257 |

FOREIGN PATENT DOCUMENTS

| | | | |
|---|---|---|---|
| CN | 103341699 A | | 10/2013 |
| EP | 1 614 500 A1 | | 1/2006 |
| EP | 2 422 918 A1 | | 2/2012 |
| JP | 6-344180 A | | 12/1994 |
| JP | 9-70687 A | | 3/1997 |
| JP | 09070687 A | * | 3/1997 |
| JP | 2003-126987 A | | 5/2003 |
| JP | 2004-188453 A | | 7/2004 |
| JP | 2008-521619 A | | 6/2006 |
| JP | 2008-168322 A | | 7/2006 |
| JP | 4428448 B2 | | 3/2010 |
| JP | 2012-106280 A | | 6/2012 |
| JP | 5238088 B1 | | 7/2013 |
| JP | 2013-193092 A | | 9/2013 |
| JP | 5349703 B1 | | 11/2013 |
| JP | 2013-252548 A | | 12/2013 |
| JP | 2014-008523 A | | 1/2014 |
| JP | 2014-37005 A | | 2/2014 |
| JP | 5590272 B1 | | 9/2014 |
| TW | 201410374 A | | 3/2014 |
| WO | WO 98/48069 A1 | | 10/1998 |
| WO | WO 02/40213 A1 | | 5/2002 |
| WO | WO 0240213 A1 | * | 5/2002 ........... B23K 35/262 |
| WO | WO 2008/004531 A2 | | 1/2008 |
| WO | WO 2009/011341 A1 | | 1/2009 |
| WO | WO 2009/011392 A1 | | 1/2009 |
| WO | WO 2010/122764 A1 | | 10/2010 |
| WO | WO 2012/056753 A1 | | 5/2012 |
| WO | WO 2012/115268 A1 | | 8/2012 |
| WO | WO 2012/127642 A1 | | 9/2012 |
| WO | 2013/017885 A2 | | 2/2013 |
| WO | WO 2014/002303 A1 | | 1/2014 |
| WO | WO 2014/013632 A1 | | 1/2014 |
| WO | WO 2014/013847 A1 | | 1/2014 |

OTHER PUBLICATIONS

Written Opinion (PCT/ISA/237) dated Oct. 7, 2014, by the Japanese Patent Office as the International Searching Authority for International Application No. PCT/JP2014/072576.

PCT International Preliminary Report on Patentability (IPRP) and Written Opinion dated Dec. 27, 2016, International Application No. PCT/JP2014/072575. (10 pages).

Notice of Allowance issued by the U.S. Patent and Trademark Office dated Dec. 4, 2017 in copending U.S. Appl. No. 14/442,628. (14 pages).

* cited by examiner

SOLDER ALLOY, SOLDER PASTE, AND ELECTRONIC CIRCUIT BOARD

TECHNICAL FIELD

The present invention relates to a solder alloy, a solder paste, and an electronic circuit board, to be specific, to a solder alloy, a solder paste containing the solder alloy, and furthermore, an electronic circuit board obtained by using the solder paste.

BACKGROUND ART

In metal connection in electrical and electronic devices or the like, solder connection using a solder paste has been generally used and in such a solder paste, a solder alloy containing lead has been conventionally used.

However, in view of environmental load, the use of lead has been recently required to be suppressed and thus, the development of a solder alloy without containing lead (lead-free solder alloy) has been promoted.

As such a lead-free solder alloy, for example, a tin-copper alloy, a tin-silver-copper alloy, a tin-silver-indium-bismuth alloy, a tin-bismuth alloy, and a tin-zinc alloy have been well known and among all, a tin-silver-copper alloy, a tin-silver-indium-bismuth alloy, and the like have been widely used.

As such a lead-free solder alloy, to be more specific, an Sn solder alloy containing Ag at a ratio of 0.5 to 5 weight %, In at a ratio of 0.5 to 20 weight %, Bi at a ratio of 0.1 to 3 weight %, furthermore, at least one kind selected from the group consisting of Sb, Zn, Ni, Ga, Ge, and Cu at a ratio of 3 weight % or less, and Sn as a remaining content has been proposed (ref: Patent Document 1).

In addition to the description above, as such a lead-free solder alloy, for example, a solder material containing Ag at a ratio of 1.0 to 4.0 weight %, In at a ratio of 4.0 to 6.0 weight %, Bi at a ratio of 0.1 to 1.0 weight %, furthermore, at least one or more elements selected from the group consisting of Cu, Ni, Co, Fe, and Sb at a ratio of 1 weight % or less, and Sn as a remaining content has been proposed (ref: Patent Document 2).

PRIOR ART DOCUMENT

Patent Document

Patent Document 1: Japanese Unexamined Patent Publication No. 2004-188453
Patent Document 2: WO 2010/122764

SUMMARY OF THE INVENTION

Problems to be Solved by the Invention

Meanwhile, a component soldered with such a solder alloy may be used under relatively severe temperature cycle conditions (e.g., temperature cycle between −40 and 150° C. etc.) such as an engine room of automobiles.

Thus, the solder alloy has been required to have excellent durability (among all, cooling/heating fatigue resistance), when exposed to relatively severe temperature cycle conditions. In soldering, not only an electronic component having a relatively small size (e.g., chip component having a 1005 size (1.0 mm×0.5 mm)), but also an electronic component having a relatively large size (e.g., chip component having a 1608 size (1.6 mm×0.8 mm), chip component having a 3216 size (3.2 mm×1.6 mm), etc.) may be used.

Thus, a solder alloy that is capable of excellently soldering an electronic component regardless of its size under relatively severe temperature cycle conditions has been required.

In this respect, when an electronic component having a relatively large size is soldered using the solder alloy described in Patent Documents 1 and 2 and the obtained component is exposed to relatively severe temperature cycle conditions, for example, there may be a case where the solder alloy is deformed by phase transformation, so that a short circuit occurs between the solder alloys that are adjacent to each other; a crack occurs in the solder alloy; or furthermore, damage occurs in the electronic component.

It is an object of the present invention to provide a solder alloy capable of suppressing a short circuit by phase transformation even under exposure to relatively severe temperature cycle conditions, having excellent durability regardless of the size of an electronic component to be soldered, and furthermore, capable of suppressing damage to the soldered electronic component or the like; a solder paste containing the solder alloy; and furthermore, an electronic circuit board obtained by using the solder paste.

Solution to the Problems

A solder alloy according to one aspect of the present invention substantially consists of tin, silver, indium, bismuth, and antimony, wherein with respect to the total amount of the solder alloy, the content ratio of the silver is 2.8 mass % or more and 4 mass % or less; the content ratio of the indium is 6.2 mass % or more and 9.0 mass % or less; the content ratio of the bismuth is 0.7 mass % or more and 5.0 mass % or less; the content ratio of the antimony is 0.3 mass % or more and 5.0 mass % or less; and the content ratio of the tin is the remaining ratio and the value of A in the following discriminant (1) is 4.36 or less.

$$A=0.87\times[\text{In content ratio (mass \%)}]-0.41\times[\text{Ag content ratio (mass \%)}]-0.82\times[\text{Sb content ratio (mass \%)}] \quad (1)$$

In the solder alloy, it is preferable that the content ratio of the bismuth is 1.0 mass % or more and 3.0 mass % or less.

In the solder alloy, it is preferable that the content ratio of the antimony is 1.0 mass % or more and 3.0 mass % or less.

In the solder alloy, it is preferable that the solder alloy further contains at least one element selected from the group consisting of copper, nickel, cobalt, gallium, germanium, and phosphorus and with respect to the total amount of the solder alloy, the content ratio of the element is above 0 mass % and 1 mass % or less.

A solder paste according to another aspect of the present invention contains a solder powder composed of the above-described solder alloy and flux.

An electronic circuit board according to further another aspect of the present invention includes a soldering portion by the above-described solder paste.

Effect of the Invention

In the solder alloy substantially consisting of tin, silver, indium, bismuth, and antimony at a predetermined amount, the solder alloy according to one aspect of the present invention is designed so that the value of A in the above-described discriminant (1) is a predetermined value.

Thus, the solder alloy according to one aspect of the present invention is capable of suppressing a short circuit by phase transformation even under exposure to relatively severe temperature cycle conditions, has excellent durability regardless of the size of an electronic component to be soldered, and furthermore, is capable of suppressing damage to the soldered electronic component or the like.

Also, the solder paste according to another aspect of the present invention contains the above-described solder alloy, so that it is capable of suppressing a short circuit by phase transformation even under exposure to relatively severe temperature cycle conditions, has excellent durability regardless of the size of an electronic component to be soldered, and furthermore, is capable of suppressing damage to the soldered electronic component or the like.

Also, an electronic circuit board according to further another aspect of the present invention uses the above-described solder paste in soldering, so that it is capable of suppressing a short circuit by phase transformation even under exposure to relatively severe temperature cycle conditions, has excellent durability regardless of the size of an electronic component to be soldered, and furthermore, is capable of suppressing damage to the soldered electronic component or the like.

EMBODIMENT OF THE INVENTION

A solder alloy according to one aspect of the present invention is a tin-silver-indium-bismuth solder alloy and contains, as essential components, tin (Sn), silver (Ag), indium (In), bismuth (Bi), and antimony (Sb). In other words, the solder alloy substantially consists of tin, silver, indium, bismuth, and antimony. In the specification, "substantially" means that allowing the above-described elements to be essential components and an optional component to be described later to be contained at a proportion to be described later.

In the solder alloy, the content ratio of the tin is the remaining ratio of each of the components to be described later and is appropriately set in accordance with the mixing amount of each of the components.

The content ratio of the silver is, for example, 2.8 mass % or more, or preferably 3.0 mass % or more, and, for example, 4 mass % or less, or preferably 3.8 mass % or less with respect to the total amount of the solder alloy.

When the content ratio of the silver is within the above-described range, a short circuit by phase transformation can be suppressed even under exposure to relatively severe temperature cycle conditions, excellent durability can be obtained regardless of the size of an electronic component to be soldered, and furthermore, damage to the soldered electronic component or the like can be suppressed.

On the other hand, when the content ratio of the silver is less than the above-described lower limit, durability (among all, durability in the case of being used for an electronic component having a relatively large size) in the case of being exposed to relatively severe temperature cycle conditions is poor. Also, when the content ratio of the silver is above the above-described upper limit, durability (among all, durability in the case of being used for an electronic component having a relatively large size) in the case of being exposed to relatively severe temperature cycle conditions is poor and furthermore, damage to an electronic component to be soldered may occur.

The content ratio of the indium is, for example, 6.2 mass % or more, or preferably 6.5 mass % or more, and, for example, 9.0 mass % or less, or preferably 8.0 mass % or less with respect to the total amount of the solder alloy.

When the content ratio of the indium is within the above-described range, a short circuit by phase transformation can be suppressed even under exposure to relatively severe temperature cycle conditions, excellent durability can be obtained regardless of the size of an electronic component to be soldered, and furthermore, damage to the soldered electronic component or the like can be suppressed.

To be specific, the solder alloy contains tin and silver, so that an $Ag_3Sn$ (three silver tin) structure usually exists therein. By allowing the temperature repeatedly to go up and down, such an $Ag_3Sn$ structure aggregates and may cause a crack.

On the contrary, when the indium is contained in the solder alloy at the above-described proportion, the indium and the silver form a compound and the aggregation of $Ag_3Sn$ is suppressed, so that the improvement of durability can be achieved.

Furthermore, although a component (circuit board etc.) soldered with such a solder alloy has a possibility of causing damage by being repeatedly exposed to a heated state or a cooled state, when the indium is contained in the solder alloy at the above-described proportion, the breakage of the component can be excellently suppressed.

The above-described mechanism is presumed by the inventors of the present invention and accordingly, the present invention is not limited to the above-described mechanism.

On the other hand, when the content ratio of the indium is less than the above-described lower limit, durability (among all, durability in the case of being used for an electronic component having a relatively large size) in the case of being exposed to relatively severe temperature cycle conditions is poor and furthermore, damage to an electronic component to be soldered may occur. Also, when the content ratio of the indium is above the above-described upper limit, durability (among all, durability in the case of being used for an electronic component having a relatively large size) in the case of being exposed to relatively severe temperature cycle conditions is poor and furthermore, damage to an electronic component to be soldered may occur.

The content ratio of the bismuth is, for example, 0.7 mass % or more, or preferably 1.0 mass % or more, and, for example, 5.0 mass % or less, or preferably 3.0 mass % or less with respect to the total amount of the solder alloy.

When the content ratio of the bismuth is within the above-described range, a short circuit by phase transformation can be suppressed even under exposure to relatively severe temperature cycle conditions, excellent durability can be obtained regardless of the size of an electronic component to be soldered, and furthermore, damage to the soldered electronic component or the like can be suppressed.

On the other hand, when the content ratio of the bismuth is less than the above-described lower limit, durability (among all, durability in the case of being used for an electronic component having a relatively large size) in the case of being exposed to relatively severe temperature cycle conditions is poor. Also, when the content ratio of the bismuth is above the above-described upper limit, durability (among all, durability in the case of being used for an electronic component having a relatively large size) in the case of being exposed to relatively severe temperature cycle conditions may be poor and furthermore, damage to an electronic component to be soldered occurs.

The content ratio of the antimony is, for example, 0.3 mass % or more, or preferably 1.0 mass % or more, and, for example, 5.0 mass % or less, or preferably 3.0 mass % or less with respect to the total amount of the solder alloy.

When the content ratio of the antimony is within the above-described range, a short circuit by phase transformation can be suppressed even under exposure to relatively severe temperature cycle conditions, excellent durability can be obtained regardless of the size of an electronic component to be soldered, and furthermore, damage to the soldered electronic component or the like can be suppressed.

On the other hand, when the content ratio of the antimony is less than the above-described lower limit, there may be a case where phase transformation of the solder alloy occurs, thereby causing a short circuit and durability (among all, durability in the case of being used for an electronic component having a relatively large size) in the case of being exposed to relatively severe temperature cycle conditions is poor. Also, when the content ratio of the antimony is above the above-described upper limit, durability with respect to an electronic component having a relatively large size in the case of being exposed to relatively severe temperature cycle conditions may be poor and furthermore, damage to an electronic component to be soldered occurs.

The above-described solder alloy can further contain, as an optional component, copper (Cu), nickel (Ni), cobalt (Co), gallium (Ga), germanium (Ge), phosphorus (P), and the like.

When the copper is contained, the content ratio thereof is, for example, above 0 mass % and, for example, 1.0 mass % or less with respect to the total amount of the solder alloy.

When the content ratio of the copper is within the above-described range, excellent effect of the present invention can be retained.

When the nickel is contained, the content ratio thereof is, for example, above 0 mass % and, for example, 1.0 mass % or less with respect to the total amount of the solder alloy.

When the content ratio of the nickel is within the above-described range, excellent effect of the present invention can be retained.

When the cobalt is contained, the content ratio thereof is, for example, above 0 mass % and, for example, 1.0 mass % or less with respect to the total amount of the solder alloy.

When the content ratio of the cobalt is within the above-described range, excellent effect of the present invention can be retained.

When the gallium is contained, the content ratio thereof is, for example, above 0 mass % and, for example, 1.0 mass % or less with respect to the total amount of the solder alloy.

When the content ratio of the gallium is within the above-described range, excellent effect of the present invention can be retained.

When the germanium is contained, the content ratio thereof is, for example, above 0 mass % and, for example, 1.0 mass % or less with respect to the total amount of the solder alloy.

When the content ratio of the germanium is within the above-described range, excellent effect of the present invention can be retained.

When the phosphorus is contained, the content ratio thereof is, for example, above 0 mass % and, for example, 1.0 mass % or less with respect to the total amount of the solder alloy.

When the content ratio of the phosphorus is within the above-described range, excellent effect of the present invention can be retained.

These optional components can be used alone or in combination of two or more.

When the above-described element is contained as an optional component, the content ratio thereof (in the case of being used in combination of two or more, the total amount thereof) is adjusted to be, for example, above 0 mass %, and, for example, 1.0 mass % or less with respect to the total amount of the solder alloy.

When the total amount of the content ratio of the optional components is within the above-described range, excellent effect of the present invention can be retained.

In the solder alloy, the content ratio of the indium, that of the silver, and that of the antimony are adjusted so that the value of A in the following discriminant (1) is a predetermined value to be described later.

$$A=0.87\times[\text{In content ratio (mass \%)}]-0.41\times[\text{Ag content ratio (mass \%)}]-0.82\times[\text{Sb content ratio (mass \%)}] \quad (1)$$

In the above-described discriminant (1), "In content ratio" is the content ratio (mass %) of the indium with respect to the total amount of the solder alloy; "Ag content ratio" is the content ratio (mass %) of the silver with respect to the total amount of the solder alloy; and furthermore, "Sb content ratio" is the content ratio (mass %) of the antimony with respect to the total amount of the solder alloy.

An example of the value of A in the above-described discriminant (1) includes 4.36 or less. Preferably, less than 4.20 is used.

When the value of A in the above-described discriminant (1) is not more than the above-described upper limit, a short circuit by phase transformation can be suppressed even under exposure to relatively severe temperature cycle conditions, excellent durability can be obtained regardless of the size of an electronic component to be soldered, and furthermore, damage to the soldered electronic component or the like can be suppressed.

On the other hand, when the value of A in the above-described discriminant (1) is above the above-described upper limit, there may be a case where durability (among all, durability in the case of being used for an electronic component having a relatively large size) in the case of being exposed to relatively severe temperature cycle conditions is poor and damage to an electronic component to be soldered occurs, and furthermore, a short circuit occurs by phase transformation.

Such a solder alloy can be obtained by alloying the above-described metal components by a known method such as melting the metal components in a melting furnace to be unified.

The above-described metal components used in the production of the solder alloy can contain small amount of impurities (inevitable impurities) as long as the excellent effect of the present invention is not inhibited.

Examples of the impurities include aluminum (Al), iron (Fe), zinc (Zn), and gold (Au).

The melting point of the solder alloy obtained in this manner measured by a DSC method (measurement conditions: temperature rising rate of 0.5° C./min.) is, for example, 190° C. or more, or preferably 200° C. or more, and, for example, 250° C. or less, or preferably 240° C. or less.

When the melting point of the solder alloy is within the above-described range, in a case where the solder alloy is used in the solder paste, metal connection can be easily performed with excellent workability.

In the solder alloy substantially consisting of tin, silver, indium, bismuth, and antimony at a predetermined amount, the above-described solder alloy is designed so that the value of A in the above-described discriminant (1) is a predetermined value.

Thus, the above-described solder alloy is capable of suppressing a short circuit by phase transformation even under exposure to relatively severe temperature cycle conditions, has excellent durability regardless of the size of an electronic component to be soldered, and furthermore, is capable of suppressing damage to the soldered electronic component or the like.

Thus, the solder alloy is preferably contained in the solder paste (solder paste connecting material).

To be specific, the solder paste according to another aspect of the present invention contains the above-described solder alloy and flux.

The solder alloy in a powdered shape is preferably contained in the solder paste.

The powdered shape is not particularly limited and examples thereof include a substantially complete sphere shape, a flat block shape, a needle shape, and an amorphous shape. The powdered shape is appropriately set in accordance with the properties (e.g., thixotropy, viscosity, etc.) required for the solder paste.

The average particle size (in the case of sphere shape) or the average longitudinal length (in the case of not sphere shape) of the powder of the solder alloy is, for example, 5 µm or more, or preferably 15 µm or more, and, for example, 100 µm or less, or preferably 50 µm or less in measurement by using a particle diameter and particle size distribution analyzer by a laser diffraction method.

The flux is not particularly limited and known solder flux can be used.

To be specific, the flux is mainly composed of, for example, a base resin (rosin, acrylic resin, etc.), an activator (e.g., hydrohalogenic acid salt of amine such as ethylamine and propylamine and organic carboxylic acid such as lactic acid, citric acid, and benzoic acid, etc.), and a thixotropic agent (hardened castor oil, bees wax, carnauba wax, etc.) and can further contain an organic solvent when liquid flux is used.

The solder paste can be obtained by mixing the powder composed of the above-described solder alloy with the above-described flux by a known method.

The mixing ratio of the solder alloy to the flux, as solder alloy:flux (mass ratio), is, for example, 70:30 to 90:10.

The above-described solder paste contains the above-described solder alloy, so that it is capable of suppressing a short circuit by phase transformation even under exposure to relatively severe temperature cycle conditions, has excellent durability regardless of the size of an electronic component to be soldered, and furthermore, is capable of suppressing damage to the soldered electronic component or the like.

The present invention includes an electronic circuit board including a soldering portion by the above-described solder paste.

That is, the above-described solder paste is preferably used in, for example, soldering (metal connection) of an electrode of an electronic circuit board such as an electrical and electronic device with an electronic component.

The electronic component is not particularly limited and an example thereof includes a known electronic component such as chip components (IC chip etc.), resistors, diodes, condensers, and transistors.

As the size of the electronic component, for example, in the case of generally rectangular shape in plane view, the electronic component has a length of one side of, for example, 0.2 mm or more, and, for example, 6.4 mm or less.

The electronic component has a length of the other side of, for example, 0.1 mm or more, and, for example, 3.2 mm or less.

The electronic component has a thickness of, for example, 0.05 mm or more, and, for example, 3.0 mm or less.

The product (area in plane view) of length of one side and length of the other side is, for example, 0.02 mm$^2$ or more, and, for example, 21 mm$^2$ or less.

An electronic component having the product (area in plane view) of length of one side and length of the other side of 0.5 mm$^2$ or less is classified into an electronic component having a relatively small size. To be specific, an example thereof includes an electronic component having a 1005 size (1.0 mm×0.5 mm).

Also, an electronic component having the product (area in plane view) of length of one side and length of the other side of above 0.5 mm$^2$ is classified into an electronic component having a relatively large size. To be specific, examples thereof include an electronic component having a 1608 size (1.6 mm×0.8 mm) and that having a 3216 size (3.2 mm×1.6 mm).

Also, the electronic circuit board uses the above-described solder paste in soldering, so that in the soldering portion thereof, it is capable of suppressing a short circuit by phase transformation even under exposure to relatively severe temperature cycle conditions, has excellent durability regardless of the size of the electronic component to be soldered, and furthermore, is capable of suppressing damage to the soldered electronic component or the like.

The usage of the above-described solder alloy is not limited to the above-described solder paste and can be also used in, for example, the production of a resin flux cored solder connecting material. To be specific, for example, the above-described solder alloy is formed into a linear shape with the above-described flux as a core by a known method (e.g., extrusion molding etc.), so that the resin flux cored solder connecting material can be also obtained.

Such a resin flux cored solder connecting material is also preferably used in, for example, soldering (metal connection) of an electronic circuit board such as an electrical and electronic device in the same manner as that of the solder paste.

EXAMPLES

The present invention will now be described in more detail by way of Examples and Comparative Examples. However, the present invention is not limited to the following Examples. Values in Examples shown below can be replaced with the values (that is, upper limit value or lower limit value) described in the embodiment.

Examples 1 to 46 and Comparative Examples 1 to 44

Preparation of Solder Alloy

The powder of each of the metals described in Tables 1 to 2 was mixed at the mixing ratio described in Tables 1 to 2 and each of the obtained metal mixtures was melted to be unified in a melting furnace, thereby preparing solder alloys.

In each of Examples, the value of A in the following discriminant (1) was adjusted so as to be 4.36 or less.

A=0.87×[In content ratio (mass %)]−0.41×[Ag content ratio (mass %)]−0.82×[Sb content ratio (mass %)]   (1)

The mixing ratio of tin (Sn) in each of the mixing formulations in Examples and Comparative Examples is a remaining ratio obtained by subtracting the mixing ratio (mass %) of the metals (tin (Sn), silver (Ag), indium (In), bismuth (Bi), antimony (Sb), copper (Cu), nickel (Ni), cobalt (Co), gallium (Ga), germanium (Ge), and phosphorus (P)) described in Tables 1 to 2.

The solder alloy in Example 1 is obtained by blending each of the metals of Ag, In, Bi, and Sb at a ratio shown in Table 1 and defining the remaining content as Sn.

Examples 2 to 3 are an example of the formulation in which the mixing ratio of Ag is increased with respect to the formulation in Example 1. Example 4 is an example of the formulation in which the mixing ratio of In is increased with respect to the formulation in Example 3.

Examples 5 to 7 are an example of the formulation in which the mixing ratio of Sb is increased with respect to the formulation in Examples 1 to 3. Examples 8 to 10 are an example of the formulation in which the mixing ratio of In is increased with respect to the formulation in Examples 5 to 7. Examples 11 to 12 are an example of the formulation in which the mixing ratio of In is further increased with respect to the formulation in Examples 9 to 10.

Examples 13 to 15 are an example of the formulation in which the mixing ratio of Sb is further increased with respect to the formulation in Examples 5 to 7. Examples 16 to 24 are an example of the formulation in which the mixing ratio of In is increased with respect to the formulation in Examples 13 to 15.

Examples 25 to 30 are an example of the formulation in which any one of Cu, Ni, Co, Ga, Ge, and P is added at a ratio shown in Table 1 with respect to the formulation in Example 9. Example 31 is an example of the formulation in which all of Cu, Ni, Co, Ga, Ge, and P are added at a ratio shown in Table 1.

Examples 32 and 36 are an example of the formulation in which the mixing ratio of Sb is increased or decreased with respect to the formulation in Example 9.

Examples 33 to 35 are an example of the formulation in which the mixing ratio of Bi is increased or decreased with respect to the formulation in Example 9.

Example 37 is an example of the formulation in which the mixing ratio of Bi is increased with respect to the formulation in Example 1.

Example 38 is an example of the formulation in which the mixing ratio of Sb is increased with respect to the formulation in Example 1.

Example 39 is an example of the formulation in which the mixing ratio of Bi is increased with respect to the formulation in Example 3.

Example 40 is an example of the formulation in which the mixing ratio of Sb is increased with respect to the formulation in Example 3.

Example 41 is an example of the formulation in which the mixing ratio of In is increased with respect to the formulation in Example 38.

Example 42 is an example of the formulation in which the mixing ratio of Bi is increased with respect to the formulation in Example 38.

Example 43 is an example of the formulation in which the mixing ratio of In is increased with respect to the formulation in Example 40.

Example 44 is an example of the formulation in which the mixing ratio of Bi is increased with respect to the formulation in Example 40.

Example 45 is an example of the formulation in which the mixing ratio of In and that of Bi are increased with respect to the formulation in Example 38.

Example 46 is an example of the formulation in which the mixing ratio of In and that of Bi are increased with respect to the formulation in Example 40.

Comparative Examples 1 to 2 are an example of the formulation in which the mixing ratio of Sb is decreased and the value of A in the above-described discriminant (1) is adjusted to exceed the above-described predetermined value with respect to the formulation in Examples 45 to 46.

Comparative Examples 3 to 6 are an example of the formulation in which the mixing ratio of any one of Ag, In, Bi, and Sb is decreased to be insufficient with respect to the formulation in Example 1.

Comparative Examples 7 to 10 are an example of the formulation in which the mixing ratio of any one of Ag, In, Bi, and Sb is increased to be excessive with respect to the formulation in Example 46.

Comparative Examples 11 to 18 are an example of the formulation in which the mixing ratio of any one of Ag, In, Bi, and Sb is increased or decreased to be insufficient or excessive with respect to the formulation in Example 9.

Comparative Example 19 is an example of the formulation in which the mixing ratio of In is increased and the value of A in the above-described discriminant (1) is adjusted to exceed 4.36 with respect to the formulation in Example 5.

Comparative Example 20 is an example of the formulation in which the mixing ratio of In and that of Bi are increased and the value of A in the above-described discriminant (1) is adjusted to exceed 4.36 with respect to the formulation in Example 5.

Comparative Example 21 is an example of the formulation in which the mixing ratio of In is increased and the value of A in the above-described discriminant (1) is adjusted to exceed 4.36 with respect to the formulation in Example 7.

Comparative Example 22 is an example of the formulation in which the mixing ratio of In and that of Bi are increased and the value of A in the above-described discriminant (1) is adjusted to exceed 4.36 with respect to the formulation in Example 7.

Comparative Example 23 is an example of the formulation in which the mixing ratio of Sb is decreased and the value of A in the above-described discriminant (1) is adjusted to exceed 4.36 with respect to the formulation in Example 23.

Comparative Example 24 is an example of the formulation in which the mixing ratio of Sb is decreased or that of Bi is increased, and the value of A in the above-described discriminant (1) is adjusted to exceed 4.36 with respect to the formulation in Example 23.

Comparative Examples 25 to 32 are an example of the formulation in which the mixing ratio of In is increased and the value of A in the above-described discriminant (1) is adjusted to exceed 4.36 with respect to any of the formulations in Examples 1 to 3.

Comparative Examples 33 to 36 are an example of the formulation in which the mixing ratio of In is increased and the value of A in the above-described discriminant (1) is adjusted to exceed 4.36 with respect to any of the formulations in Examples 5 to 7.

Comparative Examples 37 to 44 are obtained by blending each of the metals of Ag, In, Bi, and Sb at a ratio shown in Table 1, further adding Cu, Ni, and P at a ratio shown in Table 1, and defining the remaining content as Sn.

Preparation of Solder Paste

The obtained solder alloy was powdered so that the particle size thereof was 25 to 38 μm. The obtained powder of the solder alloy was mixed with known flux, thereby obtaining a solder paste.

Evaluation of Solder Paste

The obtained solder paste was printed in a chip component-mounted print board and a chip component was mounted thereon by a reflow method. The printing conditions of the solder paste at the time of mounting, the size of the chip component, and the like were appropriately set in accordance with each of the evaluations to be described later.

TABLE 1

| No. | Ag | In | Bi | Sb | Cu | Ni | Co | Ga | Ge | P | Discriminant A |
|---|---|---|---|---|---|---|---|---|---|---|---|
| Ex. 1 | 2.8 | 6.2 | 1.0 | 0.3 | — | — | — | — | — | — | 4.00 |
| Ex. 2 | 3.5 | 6.2 | 1.0 | 0.3 | — | — | — | — | — | — | 3.71 |
| Ex. 3 | 4.0 | 6.2 | 1.0 | 0.3 | — | — | — | — | — | — | 3.51 |
| Ex. 4 | 4.0 | 7.0 | 1.0 | 0.3 | — | — | — | — | — | — | 4.20 |
| Ex. 5 | 2.8 | 6.2 | 1.0 | 1.5 | — | — | — | — | — | — | 3.02 |
| Ex. 6 | 3.5 | 6.2 | 1.0 | 1.5 | — | — | — | — | — | — | 2.73 |
| Ex. 7 | 4.0 | 6.2 | 1.0 | 1.5 | — | — | — | — | — | — | 2.52 |
| Ex. 8 | 2.8 | 7.0 | 1.0 | 1.5 | — | — | — | — | — | — | 3.71 |
| Ex. 9 | 3.5 | 7.0 | 1.0 | 1.5 | — | — | — | — | — | — | 3.43 |
| Ex. 10 | 4.0 | 7.0 | 1.0 | 1.5 | — | — | — | — | — | — | 3.22 |
| Ex. 11 | 3.5 | 8.0 | 1.0 | 1.5 | — | — | — | — | — | — | 4.30 |
| Ex. 12 | 4.0 | 8.0 | 1.0 | 1.5 | — | — | — | — | — | — | 4.09 |
| Ex. 13 | 2.8 | 6.2 | 1.0 | 3.0 | — | — | — | — | — | — | 1.79 |
| Ex. 14 | 3.5 | 6.2 | 1.0 | 3.0 | — | — | — | — | — | — | 1.50 |
| Ex. 15 | 4.0 | 6.2 | 1.0 | 3.0 | — | — | — | — | — | — | 1.29 |
| Ex. 16 | 2.8 | 7.0 | 1.0 | 3.0 | — | — | — | — | — | — | 2.48 |
| Ex. 17 | 3.5 | 7.0 | 1.0 | 3.0 | — | — | — | — | — | — | 2.20 |
| Ex. 18 | 4.0 | 7.0 | 1.0 | 3.0 | — | — | — | — | — | — | 1.99 |
| Ex. 19 | 2.8 | 8.0 | 1.0 | 3.0 | — | — | — | — | — | — | 3.35 |
| Ex. 20 | 3.5 | 8.0 | 1.0 | 3.0 | — | — | — | — | — | — | 3.07 |
| Ex. 21 | 4.0 | 8.0 | 1.0 | 3.0 | — | — | — | — | — | — | 2.86 |
| Ex. 22 | 2.8 | 9.0 | 1.0 | 3.0 | — | — | — | — | — | — | 4.22 |
| Ex. 23 | 3.5 | 9.0 | 1.0 | 3.0 | — | — | — | — | — | — | 3.94 |
| Ex. 24 | 4.0 | 9.0 | 1.0 | 3.0 | — | — | — | — | — | — | 3.73 |
| Ex. 25 | 3.5 | 7.0 | 1.0 | 1.5 | 1.0 | — | — | — | — | — | 3.43 |
| Ex. 26 | 3.5 | 7.0 | 1.0 | 1.5 | — | 1.0 | — | — | — | — | 3.43 |
| Ex. 27 | 3.5 | 7.0 | 1.0 | 1.5 | — | — | 1.0 | — | — | — | 3.43 |
| Ex. 28 | 3.5 | 7.0 | 1.0 | 1.5 | — | — | — | 1.0 | — | — | 3.43 |
| Ex. 29 | 3.5 | 7.0 | 1.0 | 1.5 | — | — | — | — | 1.0 | — | 3.43 |
| Ex. 30 | 3.5 | 7.0 | 1.0 | 1.5 | — | — | — | — | — | 1.0 | 3.43 |
| Ex. 31 | 3.5 | 7.0 | 1.0 | 1.5 | 0.2 | 0.2 | 0.2 | 0.2 | 0.1 | 0.1 | 3.43 |
| Ex. 32 | 3.5 | 7.0 | 1.0 | 5.0 | — | — | — | — | — | — | 0.56 |
| Ex. 33 | 3.5 | 7.0 | 0.7 | 1.5 | — | — | — | — | — | — | 3.43 |
| Ex. 34 | 3.5 | 7.0 | 5.0 | 1.5 | — | — | — | — | — | — | 3.43 |
| Ex. 35 | 3.5 | 7.0 | 3.0 | 1.5 | — | — | — | — | — | — | 3.43 |
| Ex. 36 | 3.5 | 7.0 | 1.0 | 1.0 | — | — | — | — | — | — | 3.84 |
| Ex. 37 | 2.8 | 6.2 | 5.0 | 0.3 | — | — | — | — | — | — | 4.00 |
| Ex. 38 | 2.8 | 6.2 | 1.0 | 5.0 | — | — | — | — | — | — | 0.15 |
| Ex. 39 | 4.0 | 6.2 | 5.0 | 0.3 | — | — | — | — | — | — | 3.51 |
| Ex. 40 | 4.0 | 6.2 | 1.0 | 5.0 | — | — | — | — | — | — | −0.35 |
| Ex. 41 | 2.8 | 9.0 | 1.0 | 5.0 | — | — | — | — | — | — | 2.58 |
| Ex. 42 | 2.8 | 6.2 | 5.0 | 5.0 | — | — | — | — | — | — | 0.15 |
| Ex. 43 | 4.0 | 9.0 | 1.0 | 5.0 | — | — | — | — | — | — | 2.09 |
| Ex. 44 | 4.0 | 6.2 | 5.0 | 5.0 | — | — | — | — | — | — | −0.35 |
| Ex. 45 | 2.8 | 9.0 | 5.0 | 5.0 | — | — | — | — | — | — | 2.58 |
| Ex. 46 | 4.0 | 9.0 | 5.0 | 5.0 | — | — | — | — | — | — | 2.09 |

TABLE 2

| No. | Ag | In | Bi | Sb | Cu | Ni | Co | Ga | Ge | P | Discriminant A |
|---|---|---|---|---|---|---|---|---|---|---|---|
| Comp. Ex. 1 | 2.8 | 9.0 | 5.0 | 0.3 | — | — | — | — | — | — | 6.44 |
| Comp. Ex. 2 | 4.0 | 9.0 | 5.0 | 0.3 | — | — | — | — | — | — | 5.94 |
| Comp. Ex. 3 | 2.5 | 6.2 | 1.0 | 0.3 | — | — | — | — | — | — | 4.12 |
| Comp. Ex. 4 | 2.8 | 6.0 | 1.0 | 0.3 | — | — | — | — | — | — | 3.83 |
| Comp. Ex. 5 | 2.8 | 6.2 | 0.5 | 0.3 | — | — | — | — | — | — | 4.00 |
| Comp. Ex. 6 | 2.8 | 6.2 | 1.0 | 0.0 | — | — | — | — | — | — | 4.25 |
| Comp. Ex. 7 | 4.3 | 9.0 | 5.0 | 5.0 | — | — | — | — | — | — | 1.97 |
| Comp. Ex. 8 | 4.0 | 9.5 | 5.0 | 5.0 | — | — | — | — | — | — | 2.53 |
| Comp. Ex. 9 | 4.0 | 9.0 | 5.5 | 5.0 | — | — | — | — | — | — | 2.09 |
| Comp. Ex. 10 | 4.0 | 9.0 | 5.0 | 5.5 | — | — | — | — | — | — | 1.68 |
| Comp. Ex. 11 | 2.4 | 7.0 | 1.0 | 1.5 | — | — | — | — | — | — | 3.88 |
| Comp. Ex. 12 | 4.3 | 7.0 | 1.0 | 1.5 | — | — | — | — | — | — | 3.10 |
| Comp. Ex. 13 | 3.5 | 5.9 | 1.0 | 1.5 | — | — | — | — | — | — | 2.47 |
| Comp. Ex. 14 | 3.5 | 9.3 | 1.0 | 1.5 | — | — | — | — | — | — | 5.43 |
| Comp. Ex. 15 | 3.5 | 7.0 | 0.5 | 1.5 | — | — | — | — | — | — | 3.43 |
| Comp. Ex. 16 | 3.5 | 7.0 | 5.3 | 1.5 | — | — | — | — | — | — | 3.43 |
| Comp. Ex. 17 | 3.5 | 7.0 | 1.0 | 0.1 | — | — | — | — | — | — | 4.57 |
| Comp. Ex. 18 | 3.5 | 7.0 | 1.0 | 5.5 | — | — | — | — | — | — | 0.15 |
| Comp. Ex. 19 | 2.8 | 7.8 | 1.0 | 1.5 | — | — | — | — | — | — | 4.41 |
| Comp. Ex. 20 | 2.8 | 7.8 | 3.0 | 1.5 | — | — | — | — | — | — | 4.41 |
| Comp. Ex. 21 | 4.0 | 8.4 | 1.0 | 1.5 | — | — | — | — | — | — | 4.44 |
| Comp. Ex. 22 | 4.0 | 8.4 | 3.0 | 1.5 | — | — | — | — | — | — | 4.44 |
| Comp. Ex. 23 | 3.5 | 9.0 | 1.0 | 2.3 | — | — | — | — | — | — | 4.51 |
| Comp. Ex. 24 | 3.5 | 9.0 | 3.0 | 2.3 | — | — | — | — | — | — | 4.51 |
| Comp. Ex. 25 | 2.8 | 7.0 | 1.0 | 0.3 | — | — | — | — | — | — | 4.70 |
| Comp. Ex. 26 | 3.5 | 7.0 | 1.0 | 0.3 | — | — | — | — | — | — | 4.41 |
| Comp. Ex. 27 | 2.8 | 8.0 | 1.0 | 0.3 | — | — | — | — | — | — | 5.57 |
| Comp. Ex. 28 | 3.5 | 8.0 | 1.0 | 0.3 | — | — | — | — | — | — | 5.28 |
| Comp. Ex. 29 | 4.0 | 8.0 | 1.0 | 0.3 | — | — | — | — | — | — | 5.07 |
| Comp. Ex. 30 | 2.8 | 9.0 | 1.0 | 0.3 | — | — | — | — | — | — | 6.44 |
| Comp. Ex. 31 | 3.5 | 9.0 | 1.0 | 0.3 | — | — | — | — | — | — | 6.15 |
| Comp. Ex. 32 | 4.0 | 9.0 | 1.0 | 0.3 | — | — | — | — | — | — | 5.94 |
| Comp. Ex. 33 | 2.8 | 8.0 | 1.0 | 1.5 | — | — | — | — | — | — | 4.58 |
| Comp. Ex. 34 | 2.8 | 9.0 | 1.0 | 1.5 | — | — | — | — | — | — | 5.45 |
| Comp. Ex. 35 | 3.5 | 9.0 | 1.0 | 1.5 | — | — | — | — | — | — | 5.17 |
| Comp. Ex. 36 | 4.0 | 9.0 | 1.0 | 1.5 | — | — | — | — | — | — | 4.96 |
| Comp. Ex. 37 | 3.5 | 8.0 | 0.5 | 0.5 | — | — | — | — | — | — | 5.12 |
| Comp. Ex. 38 | 3.5 | 8.0 | 0.5 | 1.5 | — | — | — | — | — | — | 4.30 |
| Comp. Ex. 39 | 3.5 | 8.0 | 0.5 | 3.0 | — | — | — | — | — | — | 3.07 |
| Comp. Ex. 40 | 4.0 | 6.0 | 1.0 | 0.0 | 0.5 | — | — | — | — | — | 3.58 |
| Comp. Ex. 41 | 4.0 | 6.0 | 1.0 | 0.0 | 1.0 | — | — | — | — | — | 3.58 |
| Comp. Ex. 42 | 3.5 | 6.0 | 0.5 | 0.0 | — | 0.1 | — | — | — | — | 3.79 |
| Comp. Ex. 43 | 3.5 | 6.0 | 0.5 | 0.0 | — | — | — | — | — | 0.1 | 3.79 |
| Comp. Ex. 44 | 3.5 | 6.0 | 0.5 | 0.1 | — | — | — | — | — | — | 3.70 |

Evaluation

<Production of Electronic Circuit Board>

Each of the solder pastes obtained in Examples and Comparative Examples was printed in a chip component-mounted print board and a chip component was mounted thereon by a reflow method. The printing film thickness of the solder paste was adjusted using a metal mask having a thickness of 150 μm. After the printing of the solder paste, a chip condenser and a chip resistor component having a 1005 size and a 3216 size were mounted on a predetermined position of the above-described print board to be heated in a reflow furnace and then, the chip component was mounted thereon. The reflow conditions were set as follows: preheating of 170 to 190° C., peak temperature of 260° C., time for the furnace being at 220° C. or more to be 45 seconds, and cooling rate at the time when the temperature decreased from the peak temperature until 200° C. to be 3 to 8° C./sec.

Furthermore, the above-described print board was subjected to a cooling/heating cycle test in which it was retained under the environment of 150° C. for 30 minutes and next, retained under the environment of −40° C. for 30 minutes.

<Phase Transformation>

As for the print board in which the above-described cooling/heating cycles were repeated by 3000 cycles, the appearance of a QFN land portion (0.2 mm width land, 0.2 mm width gap) at 0.4 mm pitch was observed and the obtained results were ranked in accordance with the following criteria.

A: Deformation of the solder alloy was not confirmed.

B: Deformation of the solder alloy was confirmed, but a bridge between the solder alloys of the lands that were adjacent to each other was not confirmed.

C: A bridge was formed between the solder alloys of the lands that were adjacent to each other.

<Durability>

The chip condenser portions having a 1005 size and a 3216 size after the cooling/heating cycles of 3000 cycles were cut and the cross sections thereof were polished. Thereafter, the proportion of cracks that occurred in the solder fillet portion was ranked in accordance with the following criteria. The number of evaluation chips was 10 for each of the chip condensers having a 1005 size and a 3216 size. In each of the chip sizes, the ranking was performed based on the largest crack.

A: The proportion of the crack was 70% or less of the total length of the fillet.

B: The proportion of the crack was less than 100% of the total length of the fillet.

C: The crack completely crossed the fillet portion.

<Breakage of Component>

The chip resistor portion having a 3216 size after the cooling/heating cycles of 3000 cycles was cut and the cross section thereof was polished. Thereafter, the degree of cracks that occurred in an electrode portion of the chip resistor component itself was ranked in accordance with the following criteria. The number of evaluation chips was 10. The ranking was performed based on the largest crack.

A: A crack did not occur in the component electrode.

B: A crack occurred in the component electrode, but rupture did not occur.

C: Rupture occurred in the electrode portion by a crack of the component electrode.

<Comprehensive Evaluation>

As grading for each of the evaluations of "Phase Transformation", "Durability on Using Chip Having 1005 Size", "Durability on Using Chip Having 3216 Size", and "Breakage of Component", evaluation "A" was defined as two points with evaluation "B" as one point and evaluation "C" as zero point. Next, the total grading in each evaluation item was calculated. Based on the total grading, each of the solder pastes obtained by Examples and Comparative Examples was comprehensively evaluated in accordance with the following criteria.

A: Highly excellent (the total grading was eight points).

B: Good (the total grading was six points or seven points and evaluation "C" was not included).

C: Bad (at least one evaluation "C" was included).

TABLE 3

| No. | Phase Trans-formation | Durability 1005 Size | Durability 3216 Size | Breakage of Component | Comprehensive Evaluation |
|---|---|---|---|---|---|
| Ex. 1 | A | A | B | A | 7, B |
| Ex. 2 | A | A | B | A | 7, B |
| Ex. 3 | A | A | B | A | 7, B |
| Ex. 4 | B | A | B | A | 6, B |
| Ex. 5 | A | A | A | A | 8, A |
| Ex. 6 | A | A | A | A | 8, A |
| Ex. 7 | A | A | A | A | 8, A |
| Ex. 8 | A | A | A | A | 8, A |
| Ex. 9 | A | A | A | A | 8, A |
| Ex. 10 | A | A | A | A | 8, A |
| Ex. 11 | B | A | A | A | 7, B |
| Ex. 12 | A | A | A | A | 8, A |
| Ex. 13 | A | A | A | A | 8, A |
| Ex. 14 | A | A | A | A | 8, A |
| Ex. 15 | A | A | A | A | 8, A |
| Ex. 16 | A | A | A | A | 8, A |
| Ex. 17 | A | A | A | A | 8, A |
| Ex. 18 | A | A | A | A | 8, A |
| Ex. 19 | A | A | A | A | 8, A |
| Ex. 20 | A | A | A | A | 8, A |
| Ex. 21 | A | A | A | A | 8, A |
| Ex. 22 | B | A | A | A | 7, B |
| Ex. 23 | A | A | A | A | 8, A |
| Ex. 24 | A | A | A | A | 8, A |
| Ex. 25 | A | A | A | A | 8, A |
| Ex. 26 | A | A | A | A | 8, A |
| Ex. 27 | A | A | A | A | 8, A |
| Ex. 28 | A | A | A | A | 8, A |
| Ex. 29 | A | A | A | A | 8, A |
| Ex. 30 | A | A | A | A | 8, A |
| Ex. 31 | A | A | A | A | 8, A |
| Ex. 32 | A | A | A | B | 7, B |
| Ex. 33 | A | A | B | A | 7, B |
| Ex. 34 | A | A | A | B | 7, B |
| Ex. 35 | A | A | A | A | 8, A |
| Ex. 36 | A | A | A | A | 8, A |
| Ex. 37 | A | A | B | B | 6, B |
| Ex. 38 | A | A | A | B | 7, B |
| Ex. 39 | A | A | B | B | 6, B |
| Ex. 40 | A | A | A | B | 7, B |
| Ex. 41 | A | A | A | B | 7, B |
| Ex. 42 | A | A | A | B | 7, B |
| Ex. 43 | A | A | A | B | 7, B |
| Ex. 44 | A | A | A | B | 7, B |
| Ex. 45 | A | A | A | B | 7, B |
| Ex. 46 | A | A | A | B | 7, B |

TABLE 4

| No. | Phase Trans-formation | Durability 1005 Size | Durability 3216 Size | Breakage of Component | Comprehensive Component |
|---|---|---|---|---|---|
| Comp. Ex. 1 | C | A | B | B | 4, C |
| Comp. Ex. 2 | C | A | B | B | 4, C |
| Comp. Ex. 3 | A | B | C | A | 5, C |
| Comp. Ex. 4 | A | B | C | C | 3, C |
| Comp. Ex. 5 | A | B | C | A | 5, C |
| Comp. Ex. 6 | B | B | C | A | 4, C |
| Comp. Ex. 7 | A | B | C | B | 4, C |
| Comp. Ex. 8 | A | B | C | B | 4, C |
| Comp. Ex. 9 | A | A | B | C | 5, C |
| Comp. Ex. 10 | A | A | A | C | 6, C |
| Comp. Ex. 11 | A | B | C | A | 5, C |
| Comp. Ex. 12 | A | B | C | A | 5, C |
| Comp. Ex. 13 | A | A | B | C | 5, C |
| Comp. Ex. 14 | C | A | B | A | 5, C |
| Comp. Ex. 15 | A | B | C | A | 5, C |
| Comp. Ex. 16 | A | A | B | C | 5, C |
| Comp. Ex. 17 | C | B | C | A | 3, C |
| Comp. Ex. 18 | A | A | B | C | 5, C |
| Comp. Ex. 19 | C | A | A | A | 6, C |
| Comp. Ex. 20 | C | A | A | A | 6, C |
| Comp. Ex. 21 | C | A | A | A | 6, C |
| Comp. Ex. 22 | C | A | A | A | 6, C |
| Comp. Ex. 23 | C | A | A | A | 6, C |
| Comp. Ex. 24 | C | A | A | A | 6, C |
| Comp. Ex. 25 | C | A | B | A | 5, C |
| Comp. Ex. 26 | C | A | B | A | 5, C |
| Comp. Ex. 27 | C | A | B | A | 5, C |
| Comp. Ex. 28 | C | A | B | A | 5, C |
| Comp. Ex. 29 | C | A | B | A | 5, C |
| Comp. Ex. 30 | C | A | B | A | 5, C |
| Comp. Ex. 31 | C | A | B | A | 5, C |
| Comp. Ex. 32 | C | A | B | A | 5, C |
| Comp. Ex. 33 | C | A | A | A | 6, C |
| Comp. Ex. 34 | C | A | A | A | 6, C |
| Comp. Ex. 35 | C | A | A | A | 6, C |
| Comp. Ex. 36 | C | A | A | A | 6, C |
| Comp. Ex. 37 | C | C | C | A | 2, C |
| Comp. Ex. 38 | B | C | C | A | 3, C |

TABLE 4-continued

| No. | Phase Trans- formation | Durability 1005 Size | Durability 3216 Size | Breakage of Component | Compre- hensive Component |
|---|---|---|---|---|---|
| Comp. Ex. 39 | A | C | C | A | 4, C |
| Comp. Ex. 40 | A | A | C | C | 4, C |
| Comp. Ex. 41 | A | A | C | C | 4, C |
| Comp. Ex. 42 | A | B | C | C | 3, C |
| Comp. Ex. 43 | A | B | C | C | 3, C |
| Comp. Ex. 44 | A | B | C | C | 3, C |

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICABILITY

The solder alloy, the solder composition, and the solder paste of the present invention are used in an electronic circuit board used for electrical and electronic devices or the like.

The invention claimed is:

1. A solder alloy consisting essentially of:
tin, silver, indium, bismuth, and antimony, wherein
with respect to the total amount of the solder alloy,
the content ratio of the silver is 2.8 mass % or more and 4 mass % or less;
the content ratio of the indium is 6.2 mass % or more and 9.0 mass % or less;
the content ratio of the bismuth is 1.0 mass % or more and 5.0 mass % or less;
the content ratio of the antimony is 1.0 mass % or more and 5.0 mass % or less; and
the content ratio of the tin is the remaining ratio, and
wherein the value of A in the following discriminant (1) is 4.36 or less, $$A=0.87\times[\text{In content ratio (mass \%)}]-0.41\times[\text{Ag content ratio (mass \%)}]-0.82\times[\text{Sb content ratio (mass \%)}] \quad (1),$$

and
wherein the solder alloy satisfies:
1) Phase Transformation ranking of A or B, wherein ranking A corresponds to A: deformation of the solder alloy was not confirmed, and ranking B corresponds to B: deformation of the solder alloy was confirmed, but a bridge between solder alloys of lands that were adjacent to each other was not confirmed;
2) a Durability of a 3216 size ranking of A, wherein ranking A corresponds to A: a proportion of a crack was 70% or less of a total length of a fillet; and
3) a Breakage of Component ranking of A or B, wherein ranking A corresponds to A: a crack did not occur in a component electrode, and ranking B corresponds to B: a crack occurred in a component electrode, but rupture did not occur.

2. The solder alloy according to claim 1, wherein the content ratio of the bismuth is 1.0 mass % or more and 3.0 mass % or less.

3. The solder alloy according to claim 1, wherein the content ratio of the antimony is 1.0 mass % or more and 3.0 mass % or less.

4. A solder alloy consisting essentially of:
tin, silver, indium, bismuth, antimony, and at least one element selected from the group consisting of copper, nickel, cobalt, gallium, germanium, and phosphorus, wherein
with respect to the total amount of the solder alloy,
the content ratio of the silver is 2.8 mass % or more and 4 mass % or less;
the content ratio of the indium is 6.2 mass % or more and 9.0 mass % or less;
the content ratio of the bismuth is 1.0 mass % or more and 5.0 mass % or less;
the content ratio of the antimony is 1.0 mass % or more and 5.0 mass % or less;
the content ratio of the element is above 0 mass % and 1 mass % or less; and
the content ratio of the tin is the remaining ratio, and
wherein the value of A in the following discriminant (1) is 4.36 or less, $$A=0.87\times[\text{In content ratio (mass \%)}]-0.41\times[\text{Ag content ratio (mass \%)}]-0.82\times[\text{Sb content ratio (mass \%)}] \quad (1),$$

and
wherein the solder alloy satisfies:
1) Phase Transformation ranking of A or B, wherein ranking A corresponds to A: deformation of the solder alloy was not confirmed, and ranking B corresponds to B: deformation of the solder alloy was confirmed, but a bridge between solder alloys of lands that were adjacent to each other was not confirmed;
2) a Durability of a 3216 size ranking of A, wherein ranking A corresponds to A: a proportion of a crack was 70% or less of a total length of a fillet; and
3) a Breakage of Component ranking of A or B, wherein ranking A corresponds to A: a crack did not occur in a component electrode, and ranking B corresponds to B: a crack occurred in a component electrode, but rupture did not occur.

5. A solder paste comprising:
a solder powder composed of the solder alloy according to claim 1, and
a flux.

6. An electronic circuit board comprising:
a soldering portion by the solder paste according to claim 5.

* * * * *